United States Patent

Han

[11] Patent Number: 6,133,964
[45] Date of Patent: Oct. 17, 2000

[54] DIGITAL DEMODULATOR AND METHOD THEREFOR

[75] Inventor: Dong-seok Han, Anyang, Rep. of Korea

[73] Assignee: Samsung Electroncis Co., Ltd., Suwon, Rep. of Korea

[21] Appl. No.: 08/873,718

[22] Filed: Jun. 12, 1997

[30] Foreign Application Priority Data

Jun. 12, 1996 [KR] Rep. of Korea ................ 96-20984

[51] Int. Cl.⁷ .................................................. H04N 5/455
[52] U.S. Cl. ........................ 348/726; 375/324; 375/344
[58] Field of Search .................................. 375/321, 324, 375/344, 320, 270, 277, 326, 235; 348/726, 725, 471, 472; 455/207, 209, 204, 205, 313–316, 208; 329/304, 306, 307; H04N 5/445, 5/44, 7/00, 7/13

[56] References Cited

U.S. PATENT DOCUMENTS 5,406,587  4/1995  Horwitz et al. .
5,451,948  9/1995  Jekel ........................................ 341/139
5,479,449  12/1995  Patel et al. ................................ 375/316
5,495,203  2/1996  Harp et al. ............................... 329/306
5,754,591  5/1998  Samueli et al. ......................... 375/235
5,796,786  8/1998  Lee ......................................... 375/326
5,841,814  11/1998  Cupo ..................................... 375/321
5,859,671  1/1999  Kim ....................................... 348/537
5,933,200  8/1999  Han ....................................... 348/725

FOREIGN PATENT DOCUMENTS

0 677 923  10/1995  European Pat. Off. .

*Primary Examiner*—David E. Harvey
*Attorney, Agent, or Firm*—Staas & Halsey LLP

[57] ABSTRACT

A digital demodulator which removes frequency and phase errors existing in a digital signal and converting the error-removed digital signal into a base band signal. The digital demodulator uses a frequency that is twice the transmission rate as the frequency of the sampling clock signal of an analog-to-digital (A/D) converter, and demodulates a received signal in a digital processing using the A/D converter which is low-speed. Thus, all of the received signal processing becomes digitized.

23 Claims, 5 Drawing Sheets

DIGITAL DEMODULATOR AND METHOD THEREFOR

BACKGROUND OF THE INVENTION

1. Field of the Invention

The present invention relates to a receiver for receiving a high-definition signal, and more particularly, to a digital demodulator for a high-definition television (hereinafter, referred to as HDTV) receiver, and a method therefor.

2. Description of the Related Art

Since the advent of the black and white television and the color television, there has been a continuing trend to develop televisions that are more realistic, larger and have better definition. Accordingly, the grand alliance (GA)-HDTV system has been proposed in the U.S. in which a vestigial side band (VSB) modulation method is adopted as a modulation method of the GA-HDTV. Accordingly, as the HDTV transmission standard of the USA is determined as an 8-VSB modulation method, HDTV broadcasts will be realized in the near future.

Meanwhile, the demodulation of an existing GA-HDTV receiver is performed using an analog demodulation method. After analog demodulation of a receiving signal, digital signal processing is performed to restore the original signal.

Figure 1:
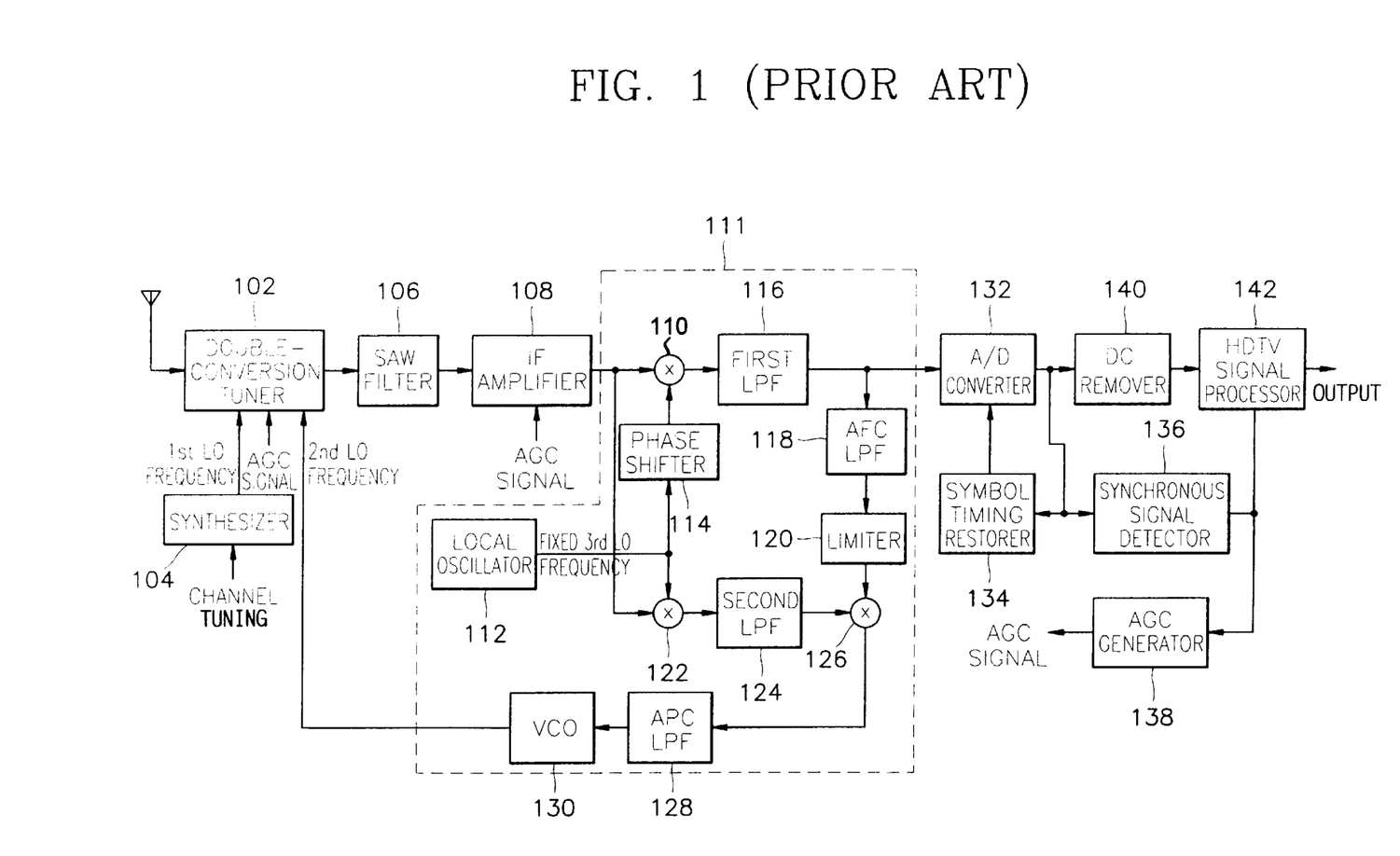
FIG. 1 is a block diagram of a high-definition TV (HDTV) receiver according to a conventional GA-VSB method.

FIG. 1 is a block diagram of a conventional GA-HDTV receiver using an 8-level VSB modulation method. Referring to FIG. 1, a received radio frequency (RF) signal is output as an intermediate frequency (IF) signal through double-conversion by a double-conversion tuner 102. That is, a synthesizer 104 provides a first local oscillation (LO) frequency to the double-conversion tuner 102 according to channel tuning. A first mixer (not shown) in the double-conversion tuner 102 mixes the received RF signal with the first local oscillation (LO) frequency to thus output a first IF signal of a predetermined frequency (920 MHz), and then constantly adjusts the amplitude of the first IF signal according to an automatic gain control (hereinafter, referred to as AGC) signal which is generated from an AGC generator 138. At this time, channel tuning is controlled by a microprocessor (not shown). The automatic gain-controlled first IF signal is mixed with a second LO frequency, which is controlled by a frequency and phase-locked loop (FPLL) circuit 111, in a second mixer (not shown) of the double-conversion tuner 102 and output as a second IF signal of a desired predetermined frequency (44 MHz).

The double-conversion tuner 102 does not accurately pass only HDTV signals having a 6 MHz band but also passes co-channel signals, since its filtering characteristics are not perfect. The co-channel signals cause interference with signals of a desired channel. Accordingly, in order to solve the above problem, the output of the double-conversion tuner 102 passes through a surface acoustic wave (SAW) filter 106 corresponding to a band pass filter having a bandwidth of exactly 6 MHz.

An IF amplifier 108, for continuously maintaining the level of an input signal of an analog-to-digital (A/D) converter 132, controls the amplitude of the IF signal passed through the SAW filter 106 according to the AGC signal generated from the AGC generator 138.

A multiplier 110 multiplies the IF signal of 6 MHz bandwidth passed through the SAW filter 106 by a sinusoidal wave signal output from a phase shifter 114 which receives a fixed third LO frequency which is generated from a local oscillator 112, thus outputting a signal demodulated into a base band. Here, the first multiplier 110 corresponds to a third mixer, and the fixed third LO frequency is 46.69 MHz corresponding to a pilot frequency.

A first low-pass filter (LPF) 116 removes a second-order harmonic component generated after demodulation and passes only base band signals. The first LPF 116 outputs an I signal on an in-phase axis. Here, when automatic frequency control (AFC) is made during frequency acquisition, an I signal, a Q signal on a quadrature-phase axis and a pilot signal are all used. However, in other data processing blocks of a receiver, only the I signal is used.

That is, an automatic frequency control low pass filter (AFC LPF) 118 outputs beat signals which are generated by a difference in frequency between the output of an internal voltage controlled oscillator (VCO) and input pilot signals. Accordingly, the radio frequency is almost removed by the AFC LPF 118 while only the pilot beat frequency remains.

A limiter 120 outputs "+1" when the output of the AFC LPF 118 is larger than "0," and otherwise, outputs "−1." Thus, the pilot beat signal is limited to a signal ±1 having a constant amplitude (±1).

Meanwhile, a second multiplier 122 multiplies the IF signal output from the IF amplifier 108 by the fixed third LO frequency output from the local oscillator 112, thus outputting a signal Q on a quadrature-phase axis.

A second LPF 124 removes a second-order harmonic component from the output of the second multiplier 122 in the same manner as that of the first LPF 116 and passes only the Q signal having a base band. A third multiplier 126 multiplies the output of the limiter 120 by the output of the second LPF 124. Thus, the result of the multiplication drives an automatic phase control low pass filter (APC LPF) 128.

The APC LPF 128 outputs a "direct current (DC)" signal, and drives a VCO 130 according to the DC signal. That is, the DC signal output from the APC LPF 128 is fed back to the double-conversion tuner 102 to reduce the above-described difference in frequency and controls the second LO frequency.

When the frequency is locked by repeating such operations, the limiter 120 outputs either "−1" or "+1." At this time, the third multiplier 126 locks the output of the limiter 120 into the phase of the third fixed LO frequency which is output through the second LPF 124. Through such a control process, phase errors of a carrier frequency in a base band frequency become "0."

Meanwhile, an A/D converter 132 samples the output of the FPLL circuit 111 according to a symbol clock signal restored by a symbol timing restorer 134 and converts it into digital data. The symbol timing restorer 134 generates a symbol clock signal and an operational clock signal of the entire system by predicting a sampling point in time of the analog-to-digital (A/D) converter 132. A synchronous signal detector 136 detects a variety of synchronous signals using the output signal of the A/D converter 132 and outputs a synchronous signal necessary for each portion to an HDTV signal processor 142, and detects a data segment synchronous signal and outputs the result to the AGC generator 138. The AGC generator 138 generates an AGC signal according to the amplitude of the data segment synchronous signal and applies the result to the double conversion tuner 102 and the IF amplifier 108.

A DC remover 140 removes a DC component generated by the nonlinear characteristic of the A/D converter 132. The HDTV signal processor 142 processes the output of the DC remover 142 and restores the result to the original signal.

As described in FIG. 1, the FPLL circuit 111 as an analog demodulator of an HDTV receiver provides an obstacle to the miniaturization of a system. Therefore, if a digital demodulator is realized instead of the analog demodulator, the entire signal processing of a receiver can be digitalized. In this case, it is easy to develop a demodulator using a single ASIC chip, and low cost of receivers and uniform performance thereof can be ensured.

However, since the conventional digital demodulator directly samples an IF signal of 44 MHz, it should use a frequency, being twice or greater than the IF signal frequency (44 MHz), as a sampling frequency. Accordingly, a high-speed A/D converter is required with a result that costs increase.

SUMMARY OF THE INVENTION

To solve the above problems, an object of the present invention is to provide a digital demodulator for digitalizing the processing of every received signal while using a low-speed A/D converter, in a receiver for receiving a high-definition signal.

It is another object of the present invention to provide a demodulation method for digitalizing the demodulation processing of received signals, in a receiver for receiving a high-definition signal.

To accomplish the first object, there is provided a digital demodulator for removing frequency and phase errors existing in a digital signal and converting the error-removed digital signal into a base band signal, for use in a receiver for receiving a high-definition signal, the digital demodulator including a phase splitter for splitting the digital signal into a first signal having a real number component and a second signal having an imaginary component; a complex multiplier for multiplying the first and second signals by first and second phase signals having predetermined frequencies, respectively, and outputting first and second base band signals; a frequency discriminator for receiving the first base band signal and detecting a frequency offset; a phase detector for multiplying the output signal of the frequency discriminator by the second base band signal and detecting a phase offset from the multiplied output to lock the output signal of the phase splitter into the phase of the second base band signal; and a digital oscillator for oscillating a pilot signal of predetermined frequency and generating the first and second phase signals of the pilot signal according to the output signal of the phase detector.

To accomplish the second object, there is provided a digital demodulation method for demodulating a digital signal into a base band signal, the digital demodulation method including the steps of (a) outputting the digital signal into first and second signals, respectively having a real number component and an imaginary component; (b) multiplying the first and second signals by first and second phase signals having predetermined frequencies, respectively, and outputting first and second base band signals; (c) detecting a frequency offset from the first base band signal; (d) multiplying the second base band signal by the detected frequency offset and detecting a phase offset from the multiplied signal; and (e) generating the first and second phase signals having a predetermined frequency of a pilot signal for compensating for the detected frequency and phase offsets and feeding the result back to the step (b).

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 2:
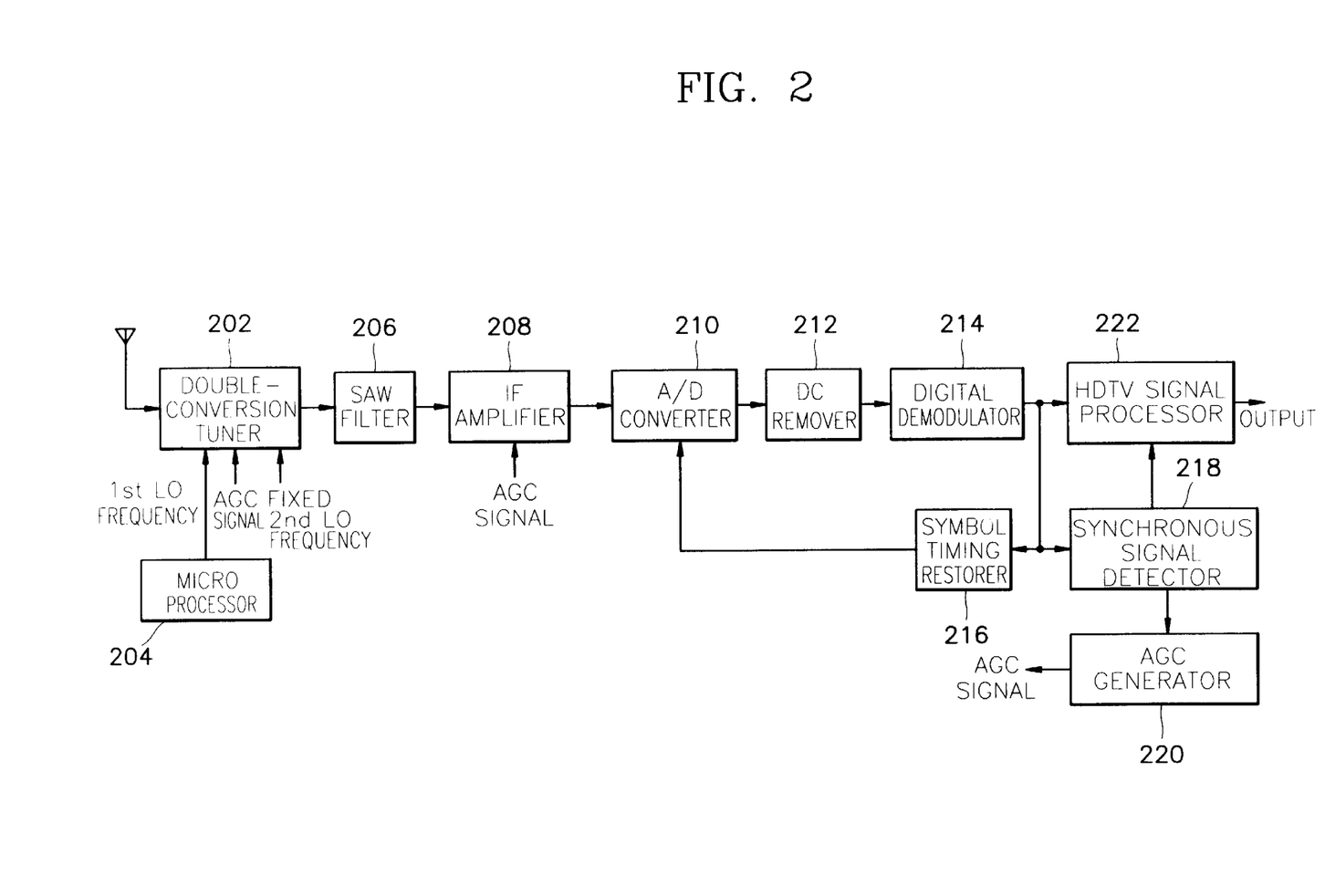
FIG. 2 is a block diagram of an HDTV receiver according to an embodiment of the present invention.

Referring to FIG. 2, an HDTV signal is received through an antenna. An RF signal of the HDTV signal is received by a double-conversion tuner 202 and is mixed with a first LO frequency, thus outputting a first IF signal having a predetermined frequency (920 MHz). The amplitude of the first IF signal is constantly controlled according to an AGC signal generated by an AGC generator 220. The gain-controlled IF signal is mixed with a second LO frequency and converted into an IF band signal of 44 MHz.

A double-conversion tuner 102 shown in FIG. 1 receives the first LO frequency according to channel selection through an unshown microprocessor and the synthesizer 104, and a second local oscillation frequency from the VCO 130 of the FPLL circuit 111 corresponding to an analog demodulator. However, in the double-conversion tuner 202 shown in FIG. 2, a first LO frequency with respect to each channel is directly controlled by a microprocessor 204, and a second LO frequency becomes a predetermined fixed frequency.

The double-conversion tuner 202 passes a signal having a bandwidth that is slightly larger than the desired signal bandwidth, so a co-channel signal is also output, resulting in a lowered performance of the receiver. Thus, a SAW filter 206 serves as a band pass filter having an excellent cut-off characteristic for removing the passed co-channel signal.

An IF amplifier 208 outputs a signal passed through the SAW filter 206 as a signal having a constant amplitude, according to the AGC signal generated from an AGC generator 220.

The sampling frequency of an A/D converter 210 for converting the output signal of the IF amplifier 208 into a digital signal is 21.52 MHz, which is twice the transmission rate (10.76 MHz) of an HDTV signal. The sampling point in time is determined by a symbol timing restorer 216. Thus, the present invention uses a frequency that is twice the transmission rate without using a predetermined multiple of the IF frequency as the sampling frequency, so that a low-speed A/D converter can be used.

A DC remover 212 removes a DC component generated by the nonlinear characteristic of the A/D converter 210, since the DC component acts disadvantageously as interference noise with respect to an actual signal after completion of demodulation. A digital demodulator 214 removes frequency and phase errors existing in a received signal using a digital IF signal and converts the result into a baseband signal which can be processed by an HDTV signal processor 222 after passing through the digital demodulator 214.

A symbol timing restorer 216 restores a symbol timing signal from the output of the digital demodulator 214, to thereby predict the sampling point of the A/D converter 210. A synchronous signal detector 218 detects various synchronous signals using the output of the digital demodulator 214 and outputs the synchronous signals necessary for each portion to an HDTV signal processor 222, and detects a data segment synchronous signal. The AGC generator 220 generates an AGC signal according to the amplitude of the data segment synchronous signal and applies it to the double-conversion tuner 202.

As is well-known, the HDTV signal processor 222 may include an NTSC removing filter for preventing degradation of an HDTV signal caused by an NTSC signal under a co-channel condition where the HDTV signal and the NTSC signal are broadcast simultaneously, an equalizer for removing multipath noise which is generated while a transmission signal is passed through a transmission channel, a phase tracking loop (PTL) circuit for removing phase noise (phase errors) not removed by a digital demodulator 214, a Trellis decoder for slicing and convolution-decoding the output of the PTL circuit in order to protect the output thereof from burst interference such as impulse noise or NTSC co-channel interference, a deinterleaver for deinterleaving the output of the Trellis decoder, a Reed-Solomon (R/S) decoder for correcting errors of the deinterleaved data using a parity, and a de-randomizer for outputting the error-corrected data as a pseudo-random sequence (PRS) code.

Figure 3A:
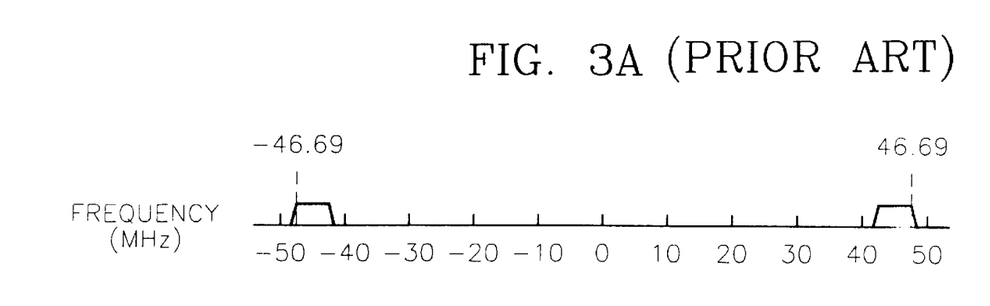
FIG. 3A is a spectral view showing the frequency of an output signal of the double-conversion tuner shown in FIG. 1.
Figure 3B:
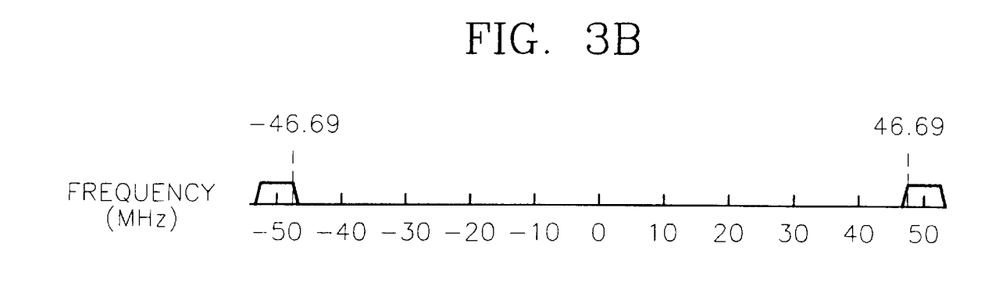
FIG. 3B is a spectral view showing the frequency of an output signal of the double-conversion tuner shown in FIG. 2.

Meanwhile, FIG. 3A shows the frequency spectrum of an output signal of the double conversion tuner 102 shown in FIG. 1, and FIG. 3B shows the frequency spectrum of the output signal of the double-conversion tuner 202 shown in FIG. 2.

The double-conversion tuner 202 proposed by the present invention is characterized in that it makes a pilot tone signal of a received HDTV signal be positioned at a low frequency portion among a signal band of 6 MHz, as shown in FIG. 3B. This can be easily realized if a second fixed LO frequency of a local oscillator in the double-conversion tuner 202 is changed by the microprocessor 204.

That is, only when the output spectrum characteristics of the double-conversion tuner 202 are the same as that shown in FIG. 3B, does aliasing not occur although the sampling rate of the A/D converter 210 is set as 21.52 MHz. If the output spectrum characteristic of the double-conversion tuner 202 is the same as that shown in FIG. 3A, the sampling of an IF signal cannot be set to 21.52 MHz.

Figure 3C:
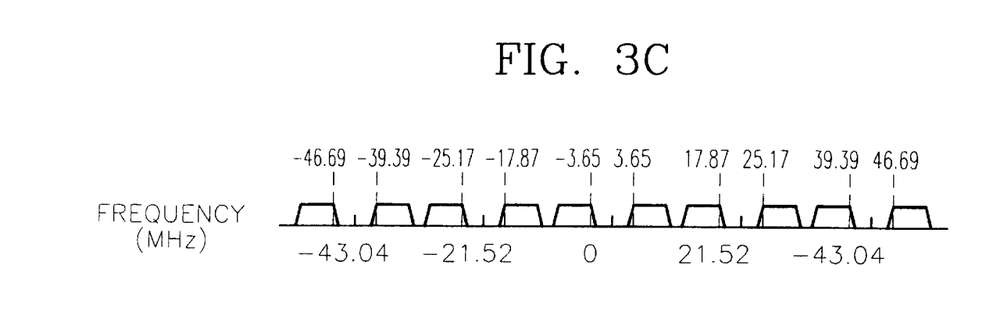
FIG. 3C is a spectral view showing the frequency of the output signal of the double-conversion tuner, which was sampled by the A/D converter shown in FIG. 2.

FIG. 3C shows a frequency spectrum when an IF band signal of 44 MHz, being the output of the double-conversion tuner 202 shown in FIG. 2, is sampled at a symbol rate of a frequency (21.52 MHz) corresponding to twice the transmission rate. That is, according to FIG. 3C, when the output of the double-conversion tuner 202 is sampled at a symbol rate (21.52 MHz) frequency twice the transmission rate, several signal spectrums are copied over the entire frequency band, which is based on sampling theory.

Therefore, the digital demodulator 214 converts an A/D converted received signal into a base band signal since the former is not the latter, and tracks frequency and phase offsets which are generated by the double conversion tuner 202.

Figure 4:
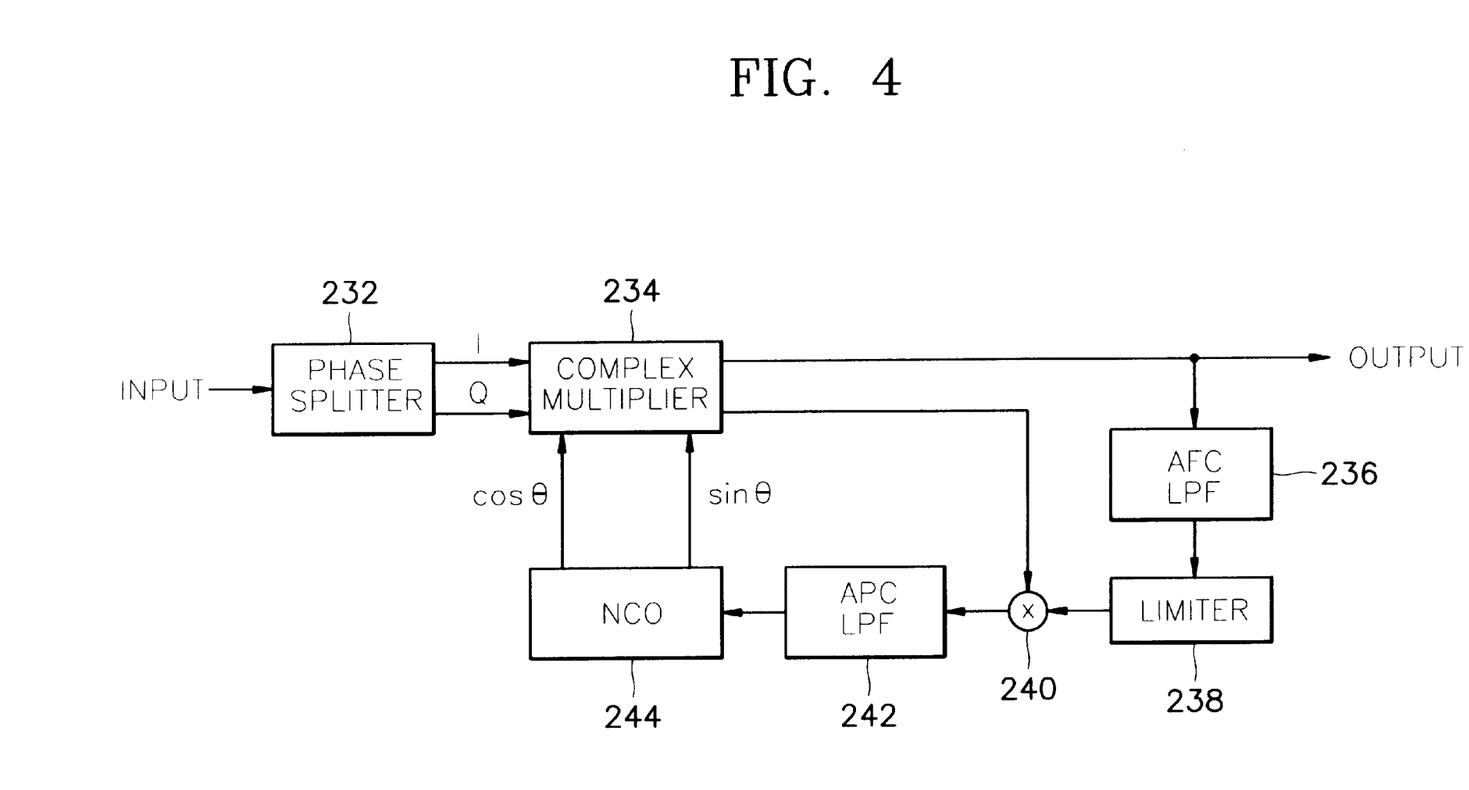
FIG. 4 is a detailed circuit diagram of the digital demodulator shown in FIG. 2.

FIG. 4 shows a detailed circuit diagram of the digital demodulator 214 according to an embodiment of the present invention. Referring to FIG. 4, a phase splitter 232 splits an input signal into real number and imaginary number components and generates complex number signals I+jQ. As an example, the phase splitter 232 can include two finite impulse response (FIR) filters, i.e., a delay and a Hilbert converter each including an FIR filter.

Figure 5A:
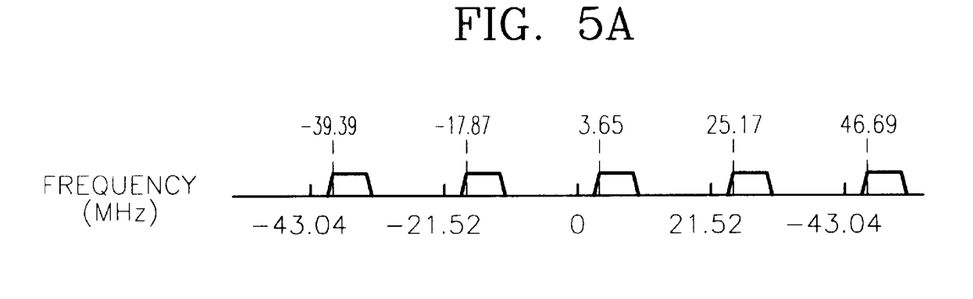
FIG. 5A is a spectral view showing the frequency of an output signal of the phase splitter shown in FIG. 4.
Figure 5B:
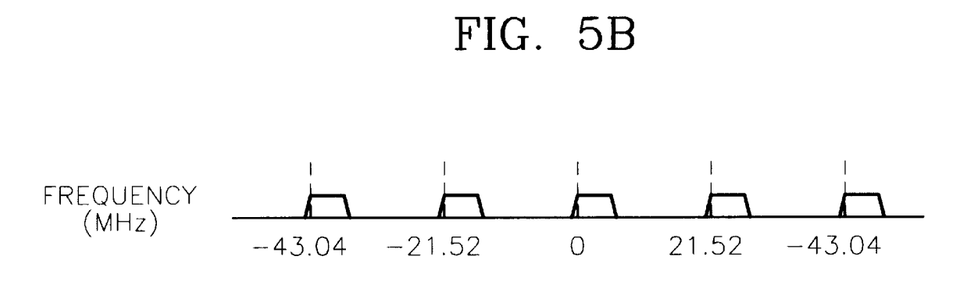
FIG. 5B is a spectral view showing the frequency of an output signal of the complex multiplier shown in FIG. 4.

A complex multiplier 234 multiplies the complex signals I+jQ output from the phase splitter 232 by both phase signals (cos θ) and (sin θ) generated from a numerically controlled oscillator (NCO) 244, thereby converting the result into a base band as shown in FIG. 5B.

That is, the output of the complex multiplier 234 can be represented by the following formula (1).

$$(I+jQ)(\cos\theta + j\sin\theta) = (I\cdot\cos\theta - Q\cdot\sin\theta) + j(I\cdot\sin\theta + Q\cdot\cos\theta) \quad (1)$$

Accordingly, the real number component of the output of the complex multiplier 234 is output to the HDTV signal processor 222 shown in FIG. 2 and simultaneously output to an AFC LPF 236, and the imaginary number component thereof is input to a multiplier 240. At this time, an initial free running frequency of the NCO 244 is set to be the same as the frequency of a pilot tone signal of 3.65 MHz among pilot tone signals shown in FIG. 5A.

Meanwhile, the AFC LPF 236 and a limiter 238 serve as a frequency discriminator, and presumes the degree of a frequency offset. That is, when frequency locking is not accomplished, the AFC LPF 236 outputs a beat signal produced by a difference in frequency between the output of the internal VCO and a pilot signal output from the complex multiplier 234. The limiter 238 outputs a value "+1" if the output of the AFC LPF 236 is greater than a value "0," and outputs a value "−1" otherwise, whereby the pilot beat signal is limited to a signal (±1) having a constant amplitude (±1).

The multiplier 240 multiplies the output of the limiter 238 by the imaginary number component output from the complex multiplier 234. An APC LPF 242 outputs the multiplied result as a DC signal. Then, the NCO 244 adjusts a local oscillation frequency according to the DC signal and feeds the result back to the complex multiplier 234. Here, the local oscillation frequency generated by the NCO 244 corresponds to a third LO frequency. The third LO frequency shown in FIG. 1 is fixed, but, in the present invention, the second LO frequency to be input to the double-conversion tuner 202 is fixed, and the third LO frequency is variable.

After the frequency acquisition occurs in this way, i.e., frequency lock is accomplished, the APC LPF 242 serves as a phase locked loop (PLL), which is a low-pass filter determining the characteristics of the PLL. The output value of the APC LPF 242 is input to the NCO 244, and the NCO 244 controls phase signals (cos θ) and (sin θ) having a local oscillation frequency. Then, the phase signals (cos θ) and (sin θ) are fed back to the complex multiplier 234. Thus, the complex multiplier 234 locks the output signals of the phase splitter 232 into the phases of the phase signals (cos θ) and (sin θ).

Figure 5C:
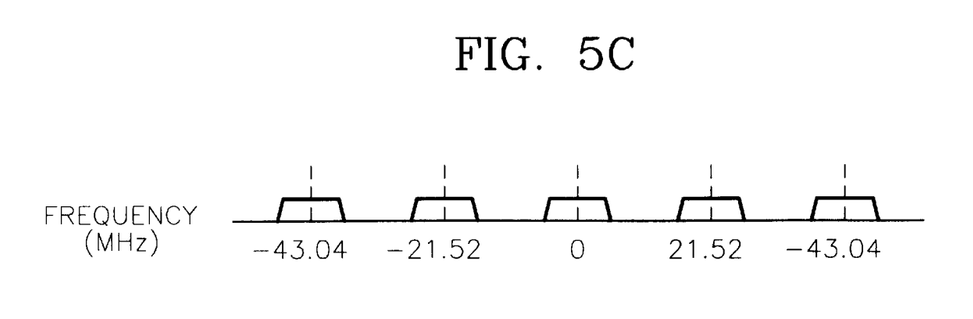
FIG. 5C is a spectral view showing the frequency of a demodulated signal according to the present invention.

FIG. 5C shows a frequency spectrum of a desired received signal after the demodulation is accomplished by the digital demodulator 214. Accordingly, only when the IF signal is sampled to a frequency being only twice the transmission rate and passed through the digital demodulator 214, may a desired result be obtained.

As described above, the present invention can employ a low-speed A/D converter by using a frequency that is twice the transmission rate as the sampling frequency, and can digitize the entire received signal processing by processing the demodulation digitally. Thus, a low-priced and uniformly-performance receiver can be obtained.

What is claimed is:

1. A digital demodulator for removing frequency and phase errors existing in a digital signal and converting the error-removed digital signal into a base band signal, for use in a receiver for receiving a high-definition signal, said digital demodulator comprising:

a phase splitter to split said digital signal into a first signal having a real number component and a second signal having an imaginary component and, in response, to output a complex signal;

a complex multiplier to multiply said complex signal by both first and second phase signals having a predetermined frequency, and to output first and second base band signals;

a frequency discriminator to receive said first base band signal and detect a frequency offset thereof;

a phase detector to multiply the output signal of said frequency discriminator by said second base band signal and, in response, to detect a phase offset from the multiplied output to lock said complex signal into said first and second phase signals of the second base band signal; and a digital oscillator to oscillate a pilot of said predetermined frequency and to generate said first and second phase signals of the pilot signal according to the output signal of said phase detector.

2. A digital demodulator as claimed in claim 1, wherein said digital oscillator comprises a numerically controlled oscillator (NCO).

3. A digital demodulator as claimed in claim 1, wherein said first and second signals are an I (in-phase) signal and a Q (quadrature) signal, respectively.

4. A digital demodulator as claimed in claim 1, wherein said pilot signal having a predetermined frequency is a pilot tone signal of 3.65 MHz.

5. A digital demodulator as claimed in claim 4, wherein said first and second phase signals are cosine and sine wave signals, respectively, each having a pilot tone frequency of 3.65 MHz.

6. A digital demodulator as claimed in claim 1, wherein said pilot signal is positioned in a low frequency band among predetermined high-definition signal bands.

7. A digital demodulator as claimed in claim 1, wherein said frequency discriminator comprises:

an automatic frequency control low pass filter (AFC LPF) to output a beat signal which is generated by a difference in frequency between an output of an internally-installed voltage controlled oscillator and said pilot signal output from said complex multiplier; and a limiter to limit said beat signal output from said AFC LPF to a signal having a constant amplitude.

8. A digital demodulator as claimed in claim 1, wherein said phase detector comprises:

a multiplier to multiply the output signal of said frequency discriminator by said second base band signal; and an automatic phase control low pass filter (APC LPF) to convert the output signal of said multiplier into a direct current signal.

9. A receiver for receiving a high-definition signal, comprising:

a tuner to convert said high-definition signal into an intermediate frequency (IF) signal based upon a first base band signal;

an analog-to-digital (A/D) converter to convert said IF signal into a digital IF signal according to a sampling clock signal having a frequency which is a predetermined multiple of a transmission rate of said high-definition signal and lower than said IF frequency; and a digital demodulator to remove frequency and phase errors existing in said digital IF signal and convert said error-removed digital IF signal into said first base band signal and a second base band signal, wherein said digital demodulator includes a phase splitter to split said digital IF signal into a first signal having a real number component and a second signal having an imaginary component and, in response, to output a complex signal, a complex multiplier to multiply said complex signal by both first and second phase signals having a predetermined frequency, and to output said first and second base band signals, respectively, a frequency discriminator to receive said first baseband signal and to detect a frequency offset thereof, a phase detector to multiply the output signal of said frequency discriminator by said second base band signal and, in response, to detect a phase offset from the multiplied output to lock said complex signal into said first and second phase signals of the second base band signal, and a digital oscillator to oscillate a pilot signal of said predetermined frequency and to generate said first and second phase signals of the pilot signal according to the output signal of said phase detector.

10. A receiver as claimed in claim 9, wherein said digital oscillator comprises a numerically controlled oscillator (NCO).

11. A receiver as claimed in claim 9, wherein said first and second signals are an I (in-phase) signal and a Q (quadrature) signal, respectively.

12. A receiver as claimed in claim 9, wherein said pilot signal having a predetermined frequency is a pilot tone signal of 3.65 MHz.

13. A receiver as claimed in claim 12, wherein said first and second phase signals are cosine and sine wave signals, respectively, each having a pilot tone frequency of 3.65 MHz.

14. A receiver as claimed in claim 9, wherein said tuner controls said pilot signal so that said pilot signal is positioned in a low frequency band among predetermined high-definition signal bands.

15. A receiver as claimed in claim 9, wherein said frequency discriminator comprises:

an automatic frequency control low pass filter (AFC LPF) to output a beat signal which is generated by a difference in frequency between an output of an internally-installed voltage controlled oscillator and said pilot signal output from said complex multiplier; and a limiter to limit said beat signal output from said AFC LPF to a signal having a constant amplitude.

16. A receiver as claimed in claim 9, wherein said phase detector comprises:

a multiplier to multiply the output signal of said frequency discriminator by said second base band signal; and an automatic phase control low pass filter (APC LPF) to convert the output signal of said multiplier into a direct current signal.

17. A digital demodulation method for demodulating a digital signal into a base band signal, said digital demodulation method comprising the steps of:

(a) splitting said digital signal into first and second signals respectively having a real number component and an imaginary component and, in response, outputting a complex signal;

(b) multiplying said complex signal by both first and second phase signals having a predetermined frequency, to output first and second base band signals;

(c) receiving said first base band signal and detecting a frequency offset thereof;

(d) multiplying said second base band signal by said detected frequency offset to generate a multiplied signal, and detecting a phase offset from the multiplied signal to lock said complex signal into said first and second phase signals of the second base band signal; and (e) generating said first and second phase signals having said predetermined frequency which are of a pilot signal for compensating for said detected frequency and phase offsets, and feeding the result back to said step (b).

18. A digital demodulation method as claimed in claim 17, wherein said first and second signals are an I (in-phase) signal and a Q (quadrature) signal, respectively.

19. A digital demodulation method as claimed in claim 17, wherein said first and second phase signals are cosine and sine wave signals, respectively, each having a pilot tone frequency of 3.65 MHz.

20. A digital demodulating method for demodulating a received high-definition signal of a radio frequency (RF) band, comprising the steps of:

(a) converting said received high-definition signal into an intermediate frequency (IF) signal based upon a first base band signal;

(b) sampling said IF signal to a frequency which is a predetermined multiple of a transmission rate of said received high-definition signal and is lower than a frequency of said IF signal, and converting the result into a digital IF signal; and (c) demodulating said digital IF signal into said first base band signal and a second base band signal, wherein said step (c) comprises the substeps of:

(c1) outputting said digital IF signal into first and second signals respectively having a real number component and an imaginary component and, in response, outputting a complex signal, (c2) multiplying said complex signal by both first and second phase signals having a predetermined frequency, and outputting said first and second base band signals, respectively, (c3) detecting a frequency offset from said first base band signal, (c4) multiplying said second base band signal by said detected frequency offset to generate a multiplied signal, and detecting a phase offset from said multiplied signal, to lock said complex signal into said first and second phase signals of the second base band signal, and (c5) generating, in accordance with the results of said step (c4), said first and second phase signals having said predetermined frequency which are of a pilot signal for compensating for said detected frequency and phase offsets and feeding the result back to said step (c2).

21. A digital demodulating method as claimed in claim 20, wherein said first and second signals are an I (in-phase) signal and a Q (quadrature) signal, respectively.

22. A digital demodulator as claimed in claim 20, wherein said first and second phase signals are cosine and sine wave signals, respectively, each having a pilot tone frequency of 3.65 MHz.

23. A receiver as claimed in claim 9, further comprising a symbol timing restorer to restore a symbol timing signal from said base band signal, and to transmit said symbol timing signal as said sampling clock signal to said analog-to-digital converter, to predict sampling points of said analog-to-digital converter.

* * * * *

UNITED STATES PATENT AND TRADEMARK OFFICE
CERTIFICATE OF CORRECTION

PATENT NO. : 6,133,964
DATED : October 17, 2000
INVENTOR(S) : Han

It is certified that error appears in the above-identified patent and that said Letters Patent is hereby corrected as shown below:

On the title page, Item 73, change "Electroncis" to --Electronics--.

Signed and Sealed this

Fifteenth Day of May, 2001

Attest:

NICHOLAS P. GODICI

Attesting Officer     Acting Director of the United States Patent and Trademark Office